(12) United States Patent
Poplack et al.

(10) Patent No.: US 10,990,728 B1
(45) Date of Patent: Apr. 27, 2021

(54) FUNCTIONAL BUILT-IN SELF-TEST ARCHITECTURE IN AN EMULATION SYSTEM

(71) Applicant: CADENCE DESIGN SYSTEMS, INC., San Jose, CA (US)

(72) Inventors: Mitchell Poplack, San Jose, CA (US); Yuhei Hayashi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/721,761

(22) Filed: Dec. 19, 2019

(51) Int. Cl.
*G06F 30/3308* (2020.01)
*G06F 9/455* (2018.01)
*G06F 7/58* (2006.01)
*G06F 11/10* (2006.01)
*G06F 30/333* (2020.01)
*G06F 30/331* (2020.01)

(52) U.S. Cl.
CPC .......... *G06F 30/3308* (2020.01); *G06F 7/584* (2013.01); *G06F 9/45508* (2013.01); *G06F 11/1004* (2013.01); *G06F 30/331* (2020.01); *G06F 30/333* (2020.01)

(58) Field of Classification Search
CPC .......................... G06F 30/3308; G06F 30/331
USPC ........................................................ 716/106
See application file for complete search history.

(56) References Cited

U.S. PATENT DOCUMENTS

2007/0239422 A1* 10/2007 Bershteyn ............. G06F 30/331
703/28
2014/0156253 A1* 6/2014 McIlvain ................ G06F 11/27
703/28

\* cited by examiner

*Primary Examiner* — Eric D Lee
(74) *Attorney, Agent, or Firm* — Foley & Lardner LLP

(57) ABSTRACT

An emulation system may have a built-in self-test circuit to generate one or more built-in self-test instructions. The one or more built-in self-test instructions may be pseudorandom. The one or more built-in self-test instructions may cause one or more emulation processors of the emulation system to generate one or more deterministic outputs. A testing processor of the emulation system may compare the one or more deterministic outputs to detect a faulty emulation processor, a faulty emulation processor cluster, or a faulty emulation chip of the emulation system.

20 Claims, 5 Drawing Sheets

200

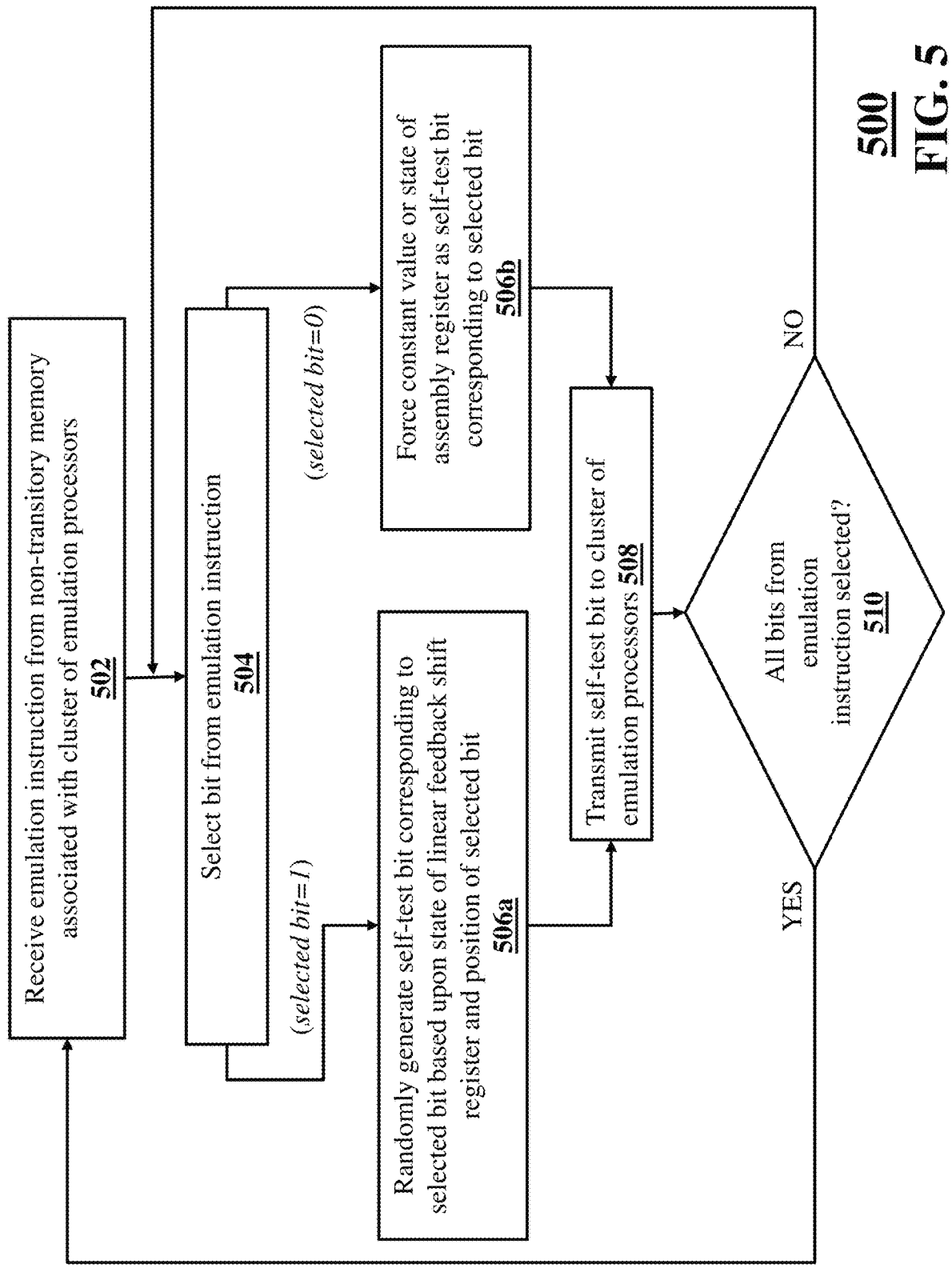

FUNCTIONAL BUILT-IN SELF-TEST ARCHITECTURE IN AN EMULATION SYSTEM

TECHNICAL FIELD

This application is generally directed towards emulating integrated circuit designs, and more specifically towards a built-in self-test architecture in an emulation system.

BACKGROUND

Modern semiconductor based integrated circuits are incredibly complex and contain millions of circuit devices, such as transistors, and millions of interconnections between the circuit devices. Designing such complex integrated circuits cannot be accomplished manually, and circuit designers use computer-based electronic design automation tools for synthesis, debugging, and functional verification of the integrated circuits. A significant function of the electronic design automation tools is an emulation of a logical system (e.g., an integrated circuit design) to perform pre-silicon functional verification, firmware and software development, and post-silicon debug. To achieve this, a typical processor-based emulation system includes several application specific integrated circuits all working together to execute a program generated by an emulation compiler generated from the integrated circuit design. The compiled program code may model a design under test that is a logical representation of the integrated circuit design running on the emulation system.

The emulation system may include one or more emulation chips, which may further include one or more hardware components, such as one or more emulation processors capable of processor-based (e.g., hardware-based) emulation of the integrated circuit design to test capabilities of the integrated circuit design. By executing various forms of programmable logic, the one or more emulation chips may be programmed to mimic functionality of the integrated circuit design that may be undergoing testing.

The emulation system may include a number of resources to prototype the integrated circuit design using reprogrammable computing hardware before a manufacturer may expend resources manufacturing a logic system product based on the integrated circuit design. The resources may include complex circuits, which may further include various types of logic gates, such as registers, Boolean logic gates, memories, and the like. The resources may further include hardware emulators having identical emulation processors arranged into groups of emulation processors known as clusters. Each emulation processor cluster may include different types of connections, data paths, memory paths, and control paths. The complexity and the number of connections present within each emulation processor cluster is considerably high.

An output of each emulation processor cluster may depend on one or more emulation instructions (for example, mission instructions) within a control store and one or more inputs to each emulation processor within the emulation processor cluster. When any emulation chip within the emulation system may have hardware defects in any of its paths, such as inputs paths, output paths, or memory paths, it may be extremely difficult to detect output failures because each emulation processor cluster on the emulation chip is capable of an independent operation to emulate a logic gate and mimic a function of the logic gate in the integrated circuit design.

To prevent such output failures, the emulation system may be tested on a regular basis to detect any defect in its components using a conventional diagnostics software. However, conventional software-based testing of the emulation system using the diagnostics software is inadequate. For instance, the diagnostics software may generate testing instructions, which may be downloaded to a memory. The number of testing instructions that may be downloaded to the memory may depend on a size limit of the memory. Once all the testing instructions are downloaded to the memory, the conventional software-based testing may be confined to running a same set of the testing instructions to test the emulation system.

Because only a limited number of testing instructions can be downloaded to memory for execution, test coverage of a software-based test for the emulation system using the diagnostics software is very low, as the testing instructions may not utilize a majority of components, data paths, control paths, etc., of the emulation system. As a result, the conventional software-based testing of the emulation system may require multiple time-consuming test runs, and a new set of testing instructions may have to be generated using a different seed for a better test coverage. Moreover, there is still no mechanism available to determine a total number of test runs, which may be needed to have a complete test coverage of the emulation system. Therefore, the software-based testing of the emulation system using the conventional diagnostics software is very inefficient and cumbersome.

SUMMARY

What is therefore desired is an emulation system, which may have a built-in hardware to generate one or more built-in self-test instructions so that a test coverage of the emulation system may be increased by running many cycles instead of many test runs with different sets of built-in self-test instructions. The one or more built-in self-test instructions may be pseudorandom, but the one or more built-in self-test instructions may cause one or more emulation processors of the emulation system to generate one or more deterministic outputs such that a testing processor can compare and evaluate the one or more deterministic outputs to detect a faulty emulation processor, a faulty emulation processor cluster, or a faulty emulation chip within the emulation system.

A self-test circuit may be embedded within the emulation system, which generates one or more pseudorandom self-test instructions based upon one or more emulation instructions. For example, when an emulation instruction bit is 1, the self-test circuit may generate a random bit, and when the emulation instruction bit is 0, the self-test circuit may force a constant or assembly register state value. A masking operation may be performed of the one or more pseudorandom self-test instructions not to change state values during testing process. One or more emulation processors may execute the one or more pseudorandom self-test instructions during the testing process to generate one or more deterministic outputs that can be compared and evaluated to detect a faulty portion in the emulation system.

In one embodiment, an emulation system may include a cluster of emulation processors; a non-transitory storage medium electrically coupled to the cluster of emulation processors, and configured to store a plurality of emulation instructions to be executed by the cluster of emulation processors during an emulation cycle; a self-testing circuit electrically coupled to the cluster of emulation processors, and configured to generate a plurality of pseudorandom self-test instructions based upon the plurality of emulation instructions; the cluster of emulation processors configured to execute the plurality of pseudorandom self-test instructions and generate a corresponding plurality of deterministic outputs; and a testing processor electrically coupled to the cluster of emulation processors, and configured to determine whether the cluster of emulation processors has a hardware defect based upon the plurality of deterministic outputs.

In another embodiment, a method of self-testing a hardware emulator may include generating, by a self-testing circuit electrically coupled to a cluster of emulation processors, a plurality of pseudorandom self-test instructions based upon a plurality of emulation instructions stored in a non-transitory storage medium electrically coupled to the cluster of emulation processors; executing, by the cluster of emulation processors, the plurality of pseudorandom self-test instructions to generate a corresponding plurality of deterministic outputs; and determining, by a testing processor, whether the cluster of emulation processors has a hardware defect based upon the deterministic outputs.

BRIEF DESCRIPTION OF THE DRAWINGS

The accompanying drawings constitute a part of this specification and illustrate an embodiment of the subject matter described herein.

FIG. 5 shows a flow diagram of a method of generating self-test instructions, according to an embodiment.

DETAILED DESCRIPTION

Figure 1:
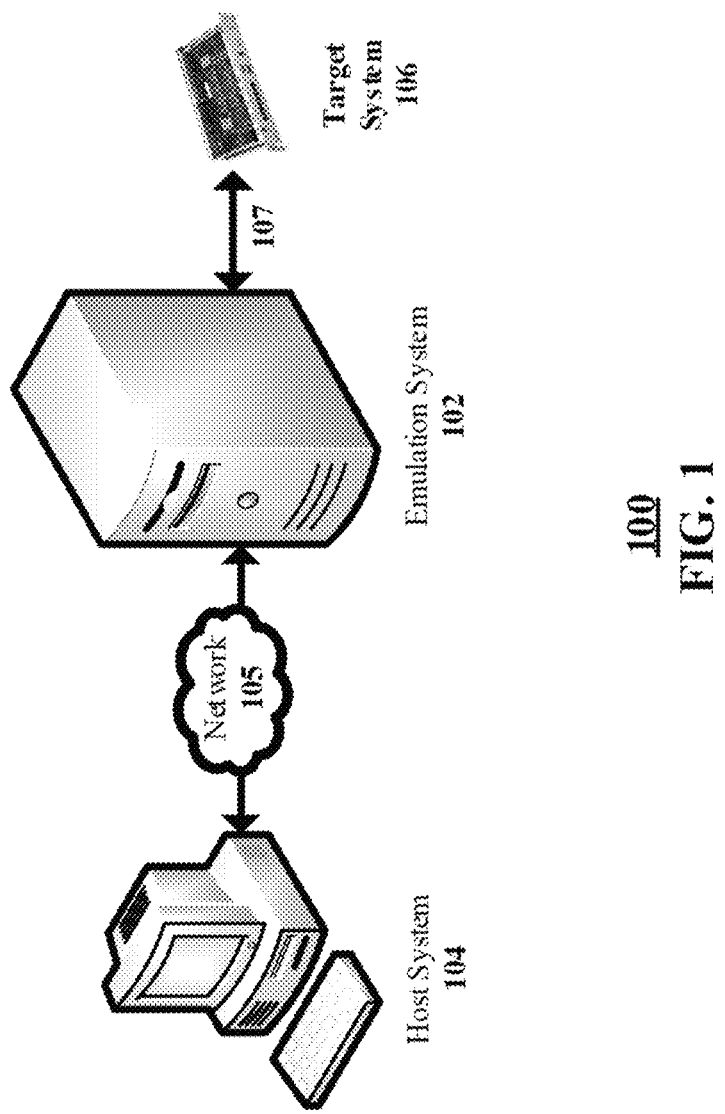
FIG. 1 shows an illustrative environment including an emulation system, according to an embodiment.

Embodiments disclosed herein describe emulation systems and methods that may include built-in hardware to generate one or more built-in self-test instructions, which may enable a better test coverage of an emulation system by running many cycles instead of many test runs with different sets of built-in self-test instructions to detect a faulty emulation processor, a faulty emulation processor cluster, or a faulty emulation chip within the emulation system. The emulation system may have a substantial control over portions of test instructions that may be randomly generated self-test instructions or have constant no-operation values, which may facilitate the efficient control of power usage or resources being used within the emulation system when these test instructions are executed.

An emulation system may include built-in hardware, such as a self-test circuit. The self-test circuit may be embedded at any level, e.g., a P8 cluster level, a P64 cluster level, a P512 cluster level, or a chip level within the emulation system. The self-test circuit may include a linear feedback shift register and a random bit generator, which generates one or more pseudorandom self-test instructions based upon one or more emulation instructions. The pseudorandom self-test instructions may be statistically random and may have a deterministic sequence. The self-test circuit may further include an assembly register, which may include constant pre-programmed no-operation values. One or more emulation processor clusters of the emulation system may receive the one or more pseudorandom self-test instructions or constant pre-programmed no-operation values as an input to generate one or more deterministic outputs. To generate the one or more deterministic outputs, a data array associated with the one or more emulation processor clusters may be pre-loaded with specific known values and the execution of the one or more pseudorandom self-test instructions may simply output these specific known values from the data array. The one or more deterministic outputs may include these specific known values.

A testing processor of the emulation system may compare and evaluate the one or more deterministic outputs to detect a faulty emulation processor, a faulty emulation processor cluster, or a faulty emulation chip of the emulation system. When the deterministic outputs include expected known values, no hardware defect associated with the faulty emulation processor, the faulty emulation processor cluster, or the faulty emulation chip is present within the emulation system. When the deterministic outputs include unexpected values, at least one hardware defect associated with the faulty emulation processor, the faulty emulation processor cluster, or the faulty emulation chip may be present within the emulation system. The hardware defect may be a manufacturing defect, such as a defective wire within the emulation system. The hardware defect may be a design defect, such as a presence of false data or control path within the emulation system. The faulty emulation processor, the faulty emulation processor cluster, or the faulty emulation chip detected within the emulation system may either be repaired or replaced with a corresponding new emulation processor, an emulation processor cluster, or an emulation chip.

FIG. 1 shows an illustrative environment 100, which may include various components, such as an emulation system 102, a host system 104, a network 105, a target system 106, and a connection 107. The emulation system 102, the host system 104, and the target system 106 may be connected to each other via the network 105 and/or the connection 107.

The host system 104 includes one or more workstations that may run debug and runtime software that may interact with the emulation system 102. The workstations may include computing devices, such as desktop computers, laptop computers, tablet computers, and smartphones.

The emulation system 102 may include a combination of hardware and software modules that may emulate a design under test. The emulation system 102 may include clusters of interconnected application specific integrated circuits, non-transitory memory devices, buffers, data storage devices configured to provide a system platform for emulating the design under test. The clusters may be arranged in multiple boards. The boards may be arranged within multiple racks. Multiple racks may be arranged in a plurality of emulation devices, which may be analogous to multi-rack servers.

The target system 106 may include hardware and/or software modules configured to interact with the design under test being emulated. For example, if the design under test is a design of a graphics processing unit, the target system 106 may be analogous to a motherboard configured to receive the graphics processing unit after fabrication. The target system 106 may be an external hardware environment provided by a user.

The network 105 may be a communication link facilitating communication between the host system 104 and the emulation system 102. For example, the network 105 may be a local area network, a metropolitan area network, a wide area network, and/or Internet. The connection 107 may also be any kind of communication link configured to facilitate a communication with the emulation system 102 and the target system 106.

It should be understood that the above described systems 102, 104, 106 of the environment 100 are merely illustrative and other configurations should be considered to be within the scope of this disclosure. For example, the network 105 may include a local connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 105 using a remote access protocol, such as internet protocol.

Figure 2:
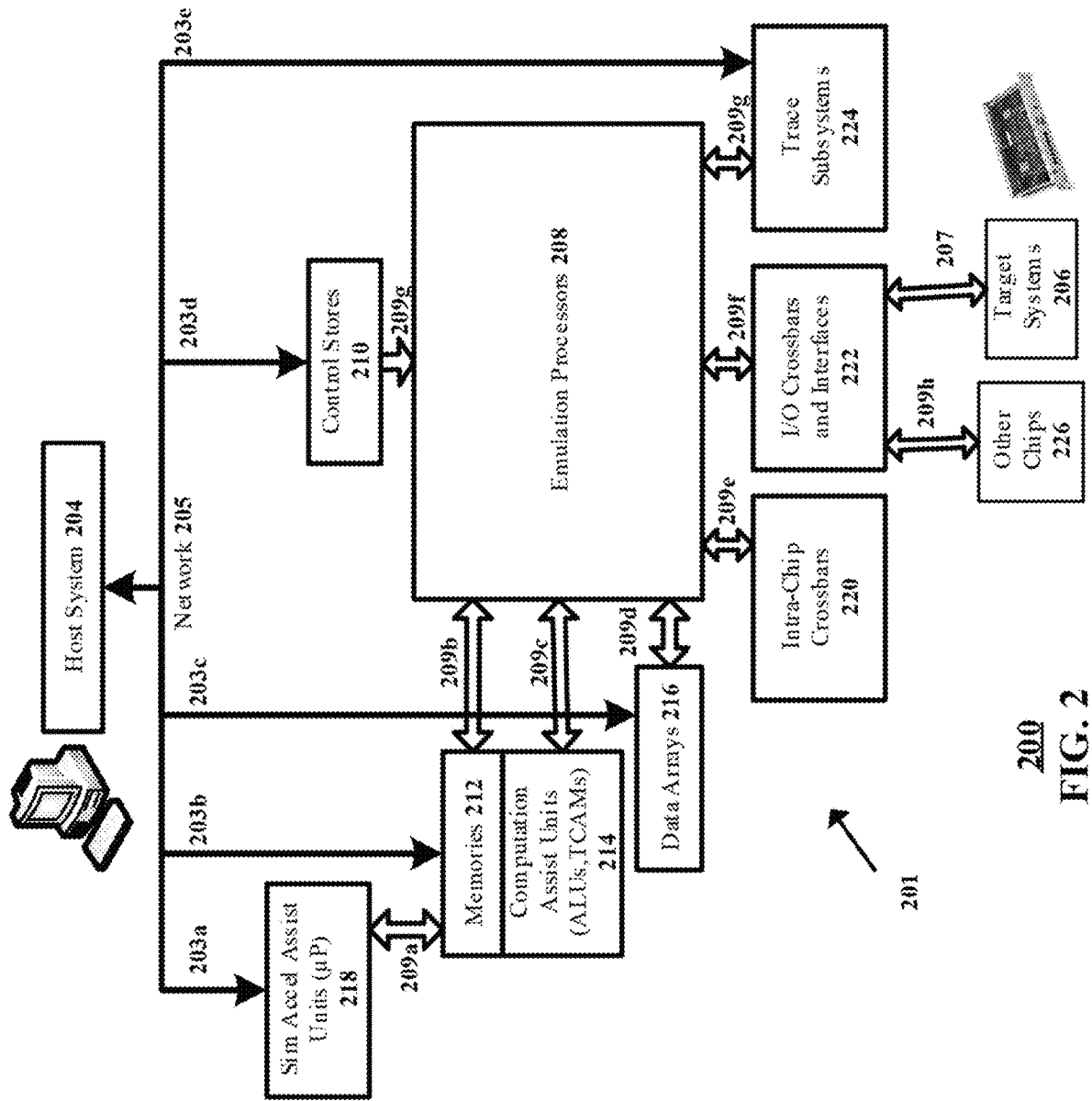
FIG. 2 shows an illustrative environment including an emulation processor, according to an embodiment.

FIG. 2 shows a more detailed view of the illustrative environment 200, particularly showing components within an application specific integrated circuit 201 of an emulation system (such as the emulation system 102 in FIG. 1). The application specific integrated circuit (ASIC) 201 may include emulation processors 208, control stores 210, memories 212, computation assist units 214, data arrays 216, simulation acceleration assist units 218, intra-chip crossbar 220, input/output (I/O) crossbars and interfaces 222, and trace subsystems 224. These components may be connected using interconnects 209a-209h. Furthermore, a network 205 (similar to the network 105 in FIG. 1) connecting the host system 204 (similar to the host system 104 in FIG. 1) with the application specific integrated circuit 201 may include interconnects 203a-203e.

Each application specific integrated circuit in the emulation system may contain a large number of emulation processors 208 (also referred to as Boolean processors). An emulation processor of the emulation processors 208 may be a computational unit configured to perform logic computation for the purpose of emulation, simulation, or prototyping of logic systems. The emulation processors 208 may include Boolean-processor-based systems, field programmable gate arrays, or the like. The emulation processors 208 may retrieve a program containing emulation instructions (for example, mission instructions) from the control stores 210 and execute the program for one or more emulation cycles (for example, mission cycles). For a design under test, the program may be same for different emulation cycles, and the data on which the program operates may change because of the change in the states of the design under test from one emulation cycle to another. These states, representing the state of the design under tests state elements, intermediate combinational nodes, and states of design memories, are stored by a cluster of emulation processors 208 (typically a cluster of 8 emulation processors 208) into data arrays 216. In some embodiments, the cluster of emulation processors 208 may store the states into other larger memories 212 that may include an internal memory and an external memory.

The application specific integrated circuit 201 may further include computation assist units 214 that the application specific integrated circuit 201 may use to model functions that may not be efficiently handled by general-purpose bitwise processors and generic memories. The computation assist units 214 may include hardware structures to perform arithmetic operations (ALUs) and to emulate ternary content-addressable memories (TCAMs). The application specific integrated circuit 201 may also include simulation acceleration assistance units 218, which may be embedded microprocessors that provide a capability for local processing of simulation acceleration or analysis tasks. The local processing of a simulation acceleration unit may be implemented along with any other simulation acceleration at the host system 204.

Intra-chip crossbars 202 provide an interface for the emulation processors 208 to interact with other processors in other application specific integrated circuits (not shown). The I/O crossbars and interfaces 222 provide an interface for the application specific integrated circuit 201 to interact with the target systems 206 (similar to the target system 106 in FIG. 1) or other external chips 226. The target systems 206 and the external chips 226 provide an external hardware environment for the design under test being emulated by the emulation system. The target systems 206 are connected to the application specific integrated circuit 201 using a connection 207 (similar to the connection 107 in FIG. 1). The trace subsystems 224 collect and/or store signals generated in the application specific integrated circuit 201 (or the emulation system in general) during the execution of the design under test. The trace subsystems 224 may function in accordance with compiler, and runtime or offline debug code to collect and store the signals. The trace subsystems 224 support two modes of operations: (i) dynamic probes, which may allow a set of user-specified probes with deep traces; and (ii) full vision, which may allow reconstruction of all user signals without user specification and without performance impact.

Figure 3:
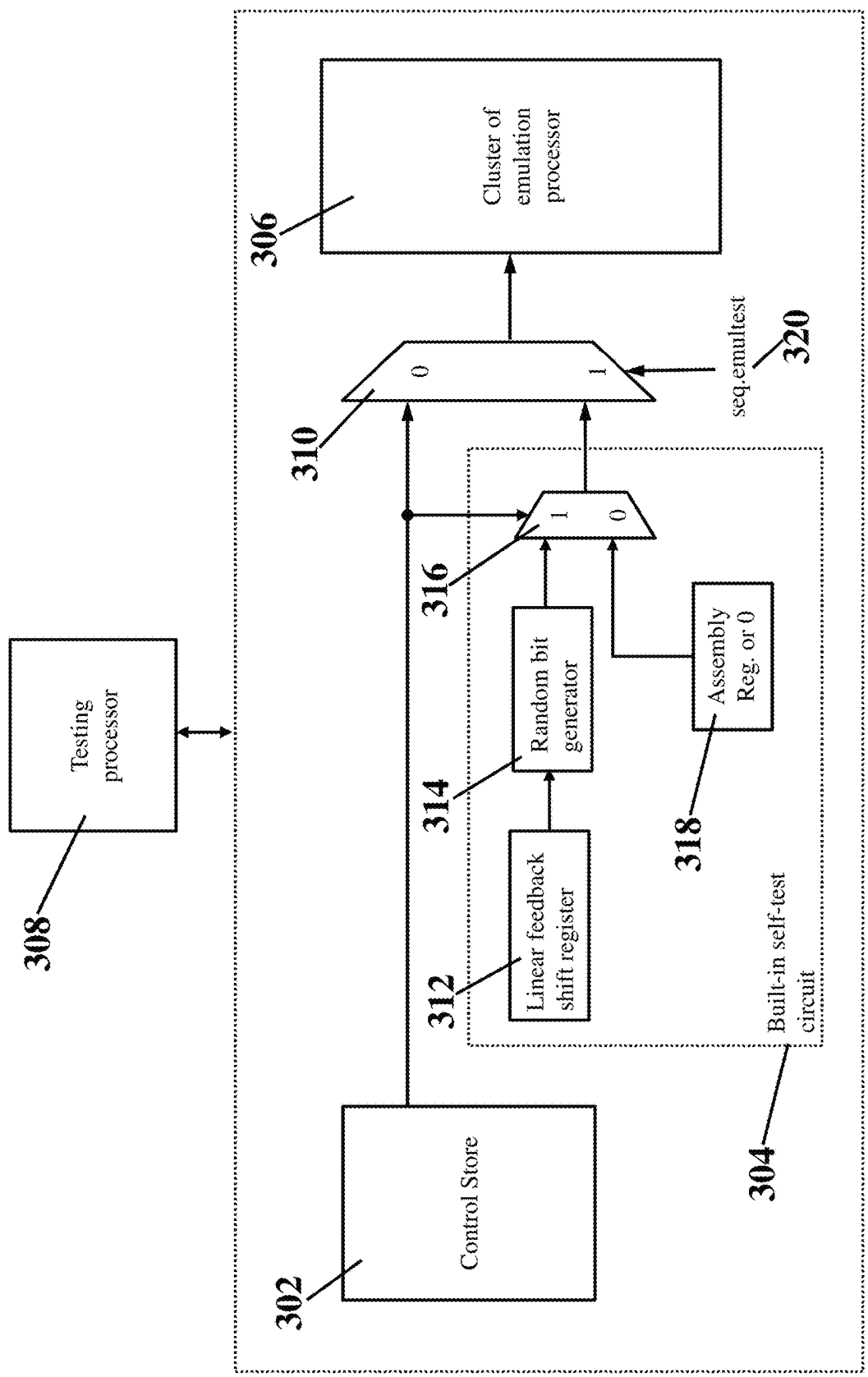
FIG. 3 shows a functional block diagram of a test system, according to an embodiment.

FIG. 3 shows a functional block diagram of a test system 300 of an application specific integrated circuit, which may support several diagnostics features in hardware. The test system 300 includes a pseudorandom logic, which generates and transmits one or more pseudorandom instructions to emulation processors to detect a faulty emulation processor among them.

The test system 300 may include various components, such as a control store 302, a built-in self-test circuit 304, a cluster of emulation processors 306, a testing processor 308, and a first selector logic 310. The built-in self-test circuit 304 may include a linear feedback shift register 312, a random bit generator 314, a second selector logic 316, and an assembly register 318. The control store 302, the built-in self-test circuit 304, and the cluster of emulation processors 306 may be electrically connected to each other. The testing processor 308 may be electrically connected to the control store 302, the built-in self-test circuit 304, and the cluster of emulation processors 306.

A control store 302 may be a non-transitory storage medium. The control store 302 may include one or more emulation instructions to be executed by the cluster of emulation processors 306. The one or more emulation instructions may instruct the cluster of emulation processors 306 to perform particular computations or processes, indicate particular inputs for executing the one or more emulation instructions, and specify a destination component (e.g., memory, another emulation processor) of the emulation system. The cluster of emulation processors 306 may retrieve a program containing the one or more emulation instructions from the control store 302, and execute the program for one or more emulation cycles.

The control store 302 may be electrically connected to the first selector logic 310, which may be electrically connected to the cluster of emulation processors 306. The first selector logic 310 may be a multiplexer. The first selector logic 310 may select the one or more emulation instructions from the control store 302 for transmission to the cluster of emulation processors 306 when a corresponding bit of a first instruction (for example, a seq.emultest instruction) 320 is 0 (e.g., during emulation cycles).

A built-in self-test circuit 304 generates one or more pseudorandom self-test instructions based upon the one or more emulation instructions from the control store 302. The built-in self-test circuit 304 may be electrically connected to the first selector logic 310, which may be electrically connected to the cluster of emulation processors 306. The first selector logic 310 selects the one or more pseudorandom self-test instructions generated by the built-in self-test circuit 304 for transmission to the cluster of emulation processors 306 when a corresponding bit of the first instruction 320 is 1 (e.g., during test cycles).

The built-in self-test circuit 304 may include a linear feedback shift register 312, which may be implemented in hardware within the emulation system. The linear feedback shift register 312 may be a shift register whose input bit is an output of a linear function of one or more of its previous states. The linear function of single bits may be an exclusive-or (XOR). An initial input value of the linear feedback shift register 312 is called a seed, and because the operation of the linear feedback shift register 312 is deterministic, a stream of values produced by the linear feedback shift register 312 can be completely determined by its current (or previous) state. The linear feedback shift register 312 may have a finite number of possible states, and for that reason, the linear feedback shift register 312 may eventually enter a repeating cycle. The linear feedback shift register 312 with a predetermined feedback function may produce a sequence of bits, which may appear random and has a very long cycle or period.

The built-in self-test circuit 304 may include a random bit generator 314, which may include a randomizer circuit. The random bit generator 314 may be electrically connected to the linear feedback shift register 312. The random bit generator 314 determines a state or a value associated with the linear feedback shift register 312. In one embodiment, the random bit generator 314 generates a random bit based upon the state of the linear feedback shift register 312. The random bit generator 314 determines a corresponding bit position of a current emulation instruction of the one or more emulation instructions. In another embodiment, the random bit generator 314 generates the random bit based upon the state of the linear feedback shift register 312 and the corresponding bit position of the current emulation instruction of the one or more emulation instructions.

The random bit generator 314 may be electrically connected to the second selector logic 316, which may be electrically connected to the first selector logic 310. The second selector logic 316 may be a multiplexer. The second selector logic 316 may select the random bit from the random bit generator 314 or an assembly register bit from the assembly register 318 based upon the value of the bit at the corresponding bit position of the emulation instruction to output a corresponding self-test bit of at least one self-test instruction corresponding to the emulation instruction. The assembly register 318 may include a fixed value, which may be preprogrammed for the assembly register bit. In operation, the second selector logic 316 may select the random bit from the random bit generator 314 when a corresponding bit of an emulation instruction is 1. The second selector logic 316 may select the assembly register bit when the corresponding bit of the emulation instruction is 0. In another embodiment, the second selector logic 316 may select between the random bit or a constant value (such as 0), which may be a hardcoded value based upon the value of the bit at the corresponding bit position of the emulation instruction to output the corresponding self-test bit of the at least one self-test instruction corresponding to the emulation instruction.

Table 1 shows a pseudocode describing a logic of the built-in self-test circuit 304.

TABLE 1

```
ASM_REG: the assembly register
CSW_IN: CSW contents from a memory
CSW_OUT: actual CSW bits to EPs
for(X=0; X<(number of CSW bits); X++) {
    if(SEQ.en == 1'b1) {
        CSW_OUT[X]= CSW_IN[X];
    } else if(SEQ.emultest == 1'b1) {
        if(CSW_IN[X] == 1'b1) {
            CSW_OUT[X] = func(X, LFSR32);
        } else {
            CSW_OUT[X] = ASM_REG[X]or 1'b0;
        }
    }
}
```

Within Table 1, a random instruction function, such as func(X, LFSR32), may randomly select 0 or 1 based on a current bit position of the emulation instruction and a current state associated with the linear feedback shift register 312. The current state associated with the linear feedback shift register 312 may be advanced when a corresponding bit of the emulation instruction is 1.

An assembly register 318 may include multiple functions. For instance, the assembly register 318 may realize hardware features, such as enabling physical memory access. The assembly register 318 may be loaded with constant values. The constant values may be configured in bit fields within the control store 302 on a bit-basis by the assembly register 318.

In P64 emulation processor, each emulation processor may include 124 bits as control store word bit fields. The assembly register 318 may include two words, which may be required with a particular format and the other six words may be a copy of these two words.

The assembly register 318 may be used to configure the linear feedback shift register 312. For instance, each P8 emulation processor within the cluster of emulation processors 306 may include multiple memory groups. Each memory group may include two linear feedback shift register sub-groups. These two sub-groups may be configured using the assembly register 318.

An assembly register 318 format is used to configure a linear feedback shift register 312 of a pseudorandom logic circuit. The pseudorandom logic circuit may generate pseudorandom keephot instructions, which may be executed to consume power when emulation instructions are not being executed.

A masking logic may include an electronic masking circuit. The masking logic may be electrically connected to the random bit generator 314 or any other component within the built-in self-test circuit 304. The masking logic receives the one or more pseudorandom self-test instructions. The masking logic processes the one or more pseudorandom self-test instructions to mask one or more bits from the one or more pseudorandom self-test instructions. The masking logic masks the one or more bits from the one or more pseudorandom self-test instructions to avoid changing any state values or updating state elements when the cluster of emulation processors 306 executes a masked version of the one or more pseudorandom self-test instructions. The state elements may include a data array, an internal memory, an external memory, etc. of the emulation system.

The masking logic may be configured to process and set one or more fields of the one or more pseudorandom self-test instructions to test each emulation processor within the cluster of emulation processors 306 operating at different levels of configuration and hierarchy within an emulation chip. The masking logic may set the one or more fields of the one or more pseudorandom self-test instructions to constants. When the cluster of emulation processors 306 are under test (for instance, when the cluster of emulation processors 306 may execute the masked version of the one or more pseudorandom self-test instructions where the one or more fields within the one or more pseudorandom self-test instructions are set to the constants), the cluster of emulation processors 306 do not communicate outside themselves. In one non-limiting example, when a first set of P512 emulation processors of the cluster of emulation processors 306 are tested, the first set of P512 emulation processors may receive and execute a first set of pseudorandom self-test instructions for a first set of test cycles. The first set of pseudorandom self-test instructions may include certain fields that are set to constants. When the first set of P512 emulation processors may execute the first set of pseudorandom self-test instructions, the first set of P512 emulation processors may not receive any signals from other devices, such as IMUXes (from the off-chip SERDES) and GMUX (from other P512s). Accordingly, the first set of P512 emulation processors under test are then isolated and each P512 emulation processor within the first set of P512 emulation processors is expected to behave and operate in a same or similar manner.

The masking logic may mask the one or more pseudorandom self-test instructions differently, to test each emulation processor within the cluster of emulation processors 306 operating at different levels of configuration and hierarchy within the emulation chip, in order to achieve isolation of each emulation processer under test and therefore testability of each emulation processor. In one instance, the masking logic may mask one or more first fields of the one or more pseudorandom self-test instructions to test P64 emulation processors of the cluster of emulation processors 306. During test, when the P64 emulation processors may execute the one or more pseudorandom self-test instructions, the P64 emulation processors may be isolated and each P64 emulation processor may be expected to behave and operate in a same or similar manner. In another instance, the masking logic may mask one or more second fields of the one or more pseudorandom self-test instructions to test P512 emulation processors of the cluster of emulation processors 306. During test, when the P512 emulation processors may execute the one or more pseudorandom self-test instructions, the P512 emulation processors may be isolated and each P512 emulation processor may be expected to behave and operate in a same or similar manner.

A pseudo python code associated with the masking logic to generate masking information for a functional built-in self-test architecture is described below.

csw_usage=<specified by a user>;
csw_fields=['alt0', 'alt1', 'alt2', 'alt3', 'ra0', 'ra1', 'ra2', 'ra3', 'ftab', 'submode', 'cfmode', 'exec_tag', 'pts', 'mc_sel', 'isi_sel', 'po_sel', 'trace', 'nbo_sel', 'gbo_sel', 'xra', 'mi_sel', 'xkeeptag', 'keeptag32', 'keeptag10', 'nbi_sel', 'xnbi_sel1', 'xnbi_sel0'];
for step in range(768):
  for ep in range(8): ##
    for field in csw_fields:
      # function returns integer value between 0 and 99.
      randomness=random.randint(0, 99);
      force_const=0;
      if((field=='mc_sel') or # to make MC_REG 0
        (field=='isi_sel' and step <3) or # to avoid to select NBI_DLY and PI_DLY at step0-2
        (field=='nbo_sel' and step <5) or # to avoid to select DSI_DLY at step0-4
        (<add more conditions if any>)):
        force_const=1;
      if(randomness <usage or !force_constant):
        # use random instructions from LFSR
        val=<all bits of "filed" is 1>;
        set_csw_field(field, val, step, ep);
      else:
        # use a constant value from the assembly register
        set_csw_field(field, 0, step, ep);

A first selector logic 310 may be a multiplexer. The first selector logic 310 may be electrically coupled to the control store 302, the built-in self-test circuit 304, and the cluster of emulation processors 306. The first selector logic 310 may select the one or more emulation instructions from the control store 302 for transmission to the cluster of emulation processors 306 when a corresponding bit of the first instruction 320 is 0 (e.g., during emulation cycles). The first selector logic 310 may select the one or more pseudorandom self-test instructions from the built-in self-test circuit 304 for transmission to the cluster of emulation processors 306 when a corresponding bit of the first instruction 322 is 1 (e.g., during test cycles).

The cluster of emulation processors 306 may receive and execute the one or more emulation instructions for the one or more emulation cycles. The one or more emulation instructions may instruct the cluster of emulation processors 306 to perform specific computations or processes, indicate specific inputs for executing the one or more emulation instructions, and specify a destination component (e.g., memory, another emulation processor) of the emulation system. When the cluster of emulation processors 306 may execute the one or more emulation instructions, the cluster of emulation processors 306 may perform useful computations.

The cluster of emulation processors 306 may be associated with a data array. The data array may be pre-loaded with specific known values. These specific known values may be outputted as outputs when the cluster of emulation processors 306 may execute the one or more pseudorandom self-test instructions for the one or more test cycles. In operation, the cluster of emulation processors 306 may receive and execute the one or more pseudorandom self-test instructions for the one or more test cycles. The one or more pseudorandom self-test instructions may cause one or more emulation processors within cluster of emulation processors 306 to generate one or more deterministic outputs such that the testing processor 308 may compare the one or more deterministic outputs to detect a faulty emulation processor within the cluster of emulation processors 306. A deterministic output of the one or more deterministic outputs may include a cyclic redundancy check (CRC) code associated with the cluster of emulation processors 306. The cyclic redundancy check code may be from a specific family of check codes. The cyclic redundancy check code may include the specific known values within the data array. The cyclic redundancy check code may be a signature that may be determined deterministically by combining a sequential state of certain observed signals.

A testing processor 308 may be electrically coupled to the cluster of emulation processors 306. The testing processor 308 may determine whether any emulation processor within the cluster of emulation processors 306 may have a hardware defect based upon evaluation of the one or more deterministic outputs outputted by the cluster of emulation processors 306.

The testing processor 308 may be associated with the data array and may have access to the specific known values within the data array. During the evaluation process, the testing processor 308 may determine whether the one or more deterministic outputs may include these specific known values. When the testing processor 308 may determine that the one or more deterministic outputs may include these specific known values, there is no hardware defect within the cluster of emulation processors 306. When the testing processor 308 may determine that the one or more deterministic outputs not include these specific known values, there may be some hardware defect within the cluster of emulation processors 306. The hardware defect may be a manufacturing defect, such as a defective wire. The hardware defect may be a design defect, such as a presence of false data or control path.

The built-in self-test circuit 304 may test each emulation processor within the cluster of emulation processors 306 operating at different levels of configuration and hierarchy within an emulation chip. The cluster of emulation processors 306 may at least include a P8 emulation processor, a P64 emulation processor, and/or a P512 emulation processor. In operation, various emulation processors within the cluster of emulation processors 306 operating at the different levels of configuration and hierarchy may execute multiple pseudorandom self-test instructions to generate corresponding multiple deterministic outputs. The multiple deterministic outputs may include multiple cyclic redundancy check codes. The testing processor 308 may evaluate the multiple cyclic redundancy check codes to determine one or more faulty emulation processors within the cluster of emulation processors 306. When the multiple deterministic outputs may include specific known values, the testing processor 308 may confirm that there is no faulty emulation processor within the cluster of emulation processors 306. When the multiple deterministic outputs may not include the specific known values, the testing processor 308 may confirm the presence of the one or more faulty emulation processors within the cluster of emulation processors 306.

In a P8 emulation processor level built-in self-test circuit configuration, each emulation processor within a cluster of eight emulation processors may receive the pseudorandom self-test instructions (for example, a first set of pseudorandom self-test instructions that are masked in order to achieve isolation of each P8 emulation processor during test) from the built-in self-test circuit 304. Each emulation processor may execute the pseudorandom self-test instructions to generate the deterministic outputs. The deterministic outputs may include the cyclic redundancy check codes. When initial values (non-zero) associated with the cyclic redundancy check codes outputted by all P8 emulation processors are same, each P8 emulation processor may be operating and functioning properly. When one or more P8 emulation processors may output the cyclic redundancy check codes having values that may be different from the values of the cyclic redundancy check codes outputted by remaining P8 emulation processors, the one or more P8 emulation processors may have a defect.

At a next level in a hierarchy of the cluster of emulation processors 306 in the application specific integrated circuit are P64 emulation processors. In a P64 emulation processor level built-in self-test circuit configuration, each P8 emulation processor within a cluster of eight P8 emulation processors may receive the pseudorandom self-test instructions (for example, a second set of pseudorandom self-test instructions that are masked in order to achieve isolation of each P64 emulation processor during test) from the built-in self-test circuit 304. Each P8 emulation processor may execute the pseudorandom self-test instructions to generate the deterministic outputs. The deterministic outputs may include the cyclic redundancy check codes. The initial values of the cyclic redundancy check codes associated with each P8 emulation processor within the cluster of eight P8 emulation processors within a same P64 emulation processor may be different. In order to determine a faulty P64 emulation processor, the values of the cyclic redundancy check codes associated with each P64 emulation processor may be compared with the values of the cyclic redundancy check codes associated with other P64 emulation processors. When the values of the cyclic redundancy check codes associated with each P8 emulation processor within a first P64 emulation processor are same as corresponding values of the cyclic redundancy check codes associated with each P8 emulation processor having a same corresponding index within a second P64 emulation processor, each P64 emulation processor may be operating and functioning properly. When the values of the cyclic redundancy check codes associated with each P8 emulation processor within the first P64 emulation processor does not match with corresponding values of the cyclic redundancy check codes associated with each P8 emulation processor having the same corresponding index within the second P64 emulation processor, at least one P8 emulation processor may have a defect. For example, when a cyclic redundancy check code associated with a first P8 emulation processor within the first P64 emulation processor does not match with a value of the cyclic redundancy check code associated with a first P8 emulation processor within the second P64 emulation processor, at least one of these first P8 emulation processors may have a defect.

P512 emulation processors are at a final level in a hierarchy of the cluster of emulation processors 306 in the application specific integrated circuit. In a P512 emulation processor level built-in self-test circuit configuration, each P64 emulation processor within a cluster of eight P64 emulation processors may receive the pseudorandom self-test instructions (for example, a third set of pseudorandom self-test instructions that are masked in order to achieve isolation of each P512 emulation processor during test) from the built-in self-test circuit 304. Each P64 emulation processor may execute the pseudorandom self-test instructions to generate the deterministic outputs. The deterministic outputs may include the cyclic redundancy check codes. The initial values of the cyclic redundancy check codes associated with each P8 emulation processor within a same P512 emulation processor may be different. In order to determine a faulty P512 emulation processor, the values of the cyclic redundancy check codes associated with each P512 emulation processor may be compared with the values of the cyclic redundancy check codes associated with other P512 emulation processors. When the values of the cyclic redundancy check codes associated with each P8 emulation processor within a first P64 emulation processor of a first P512 emulation processor are same as corresponding values of the cyclic redundancy check codes associated with each corresponding P8 emulation processor having a same corresponding index within a first P64 emulation processor of a second P512 emulation processor, each P512 emulation processor may be operating and functioning properly. When the values of the cyclic redundancy check codes associated with each P8 emulation processor within the first P64 emulation processor of the first P512 emulation processor does not match with corresponding values of the cyclic redundancy check codes associated with each P8 emulation processor having the same corresponding index within the first P64 emulation processor of the second P512 emulation processor, at least one P8 emulation processor may have a defect. For example, when a cyclic redundancy check code associated with a third P8 emulation processor within the first P64 emulation processor of the first P512 emulation processor does not match with a value of the cyclic redundancy check code associated with a third P8 emulation processor within the first P64 emulation processor of the first P512 emulation processor, at least one of these third P8 emulation processors may have a defect.

In an emulation chip level built-in self-test circuit configuration, each P8 emulation processor within each emulation chip may receive the pseudorandom self-test instructions from the built-in self-test circuit 304. Each P8 emulation processor within each emulation chip may execute the pseudorandom self-test instructions to generate the deterministic outputs. The deterministic outputs may include the cyclic redundancy check codes. The initial values of the cyclic redundancy check codes associated with each P8 emulation processor within a same emulation chip may be different. In order to determine a faulty emulation chip, all emulation chips within the emulation system may be configured in a same way to compare results. When all the emulation chips are configured in the same way, the values of the cyclic redundancy check codes associated with each emulation chip can be compared with the values of the cyclic redundancy check codes associated with other emulation chips to determine a faulty emulation chip. When the values of the cyclic redundancy check codes associated with each P8 emulation processor within a first emulation chip are same as corresponding values of the cyclic redundancy check codes associated with each P8 emulation processor having a same corresponding index within a second emulation chip, each emulation chip may be operating and functioning properly. When the values of the cyclic redundancy check codes associated with each P8 emulation processor within the first emulation chip does not match with corresponding values of the cyclic redundancy check codes associated with each P8 emulation processor having the same corresponding index within the second emulation chip, at least one P8 emulation processor may have a defect. For example, when a cyclic redundancy check code associated with a first P8 emulation processor within the first emulation chip does not match with a value of the cyclic redundancy check code associated with a first P8 emulation processor within the second emulation chip, at least one of these first P8 emulation processors may have a defect.

Figure 4:
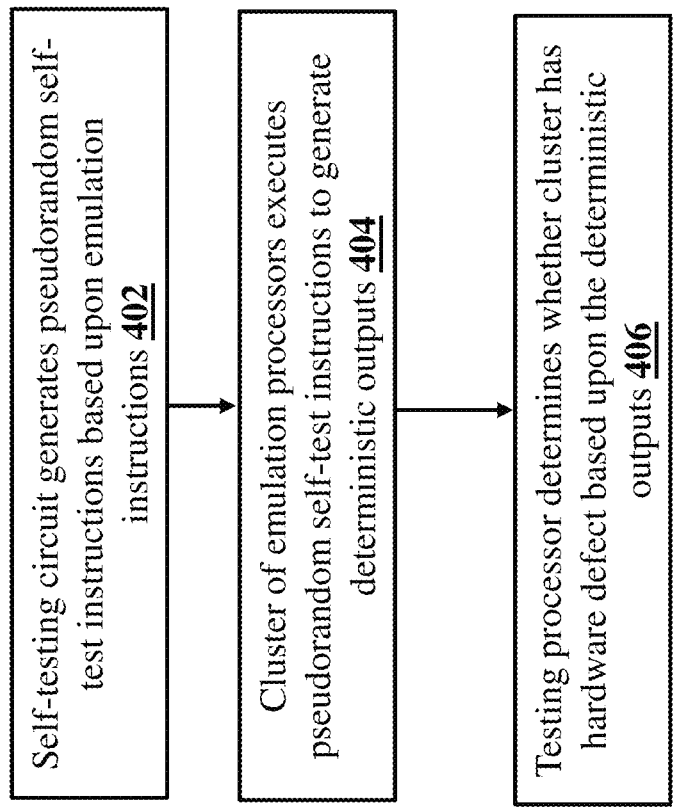
FIG. 4 shows a flow diagram of a method of self-testing an emulation system, according to an embodiment.

FIG. 4 shows execution steps for self-testing a hardware emulator of an emulation system, according to a method 400. The method 400 may include execution steps 402, 404, and 406. It should be understood that the steps described herein are merely illustrative and additional or substitute steps should also be considered to be within the scope of this disclosure. Furthermore, methods with a fewer numbers of steps should also be considered to be within the scope of this disclosure. One or more components of an emulation system may perform different steps of the method 400.

At step 402, a self-testing circuit electrically coupled to a cluster of emulation processors generates a plurality of pseudorandom self-test instructions based upon a plurality of emulation instructions, which may be stored in a non-transitory storage medium. The non-transitory storage medium may be electrically coupled to the cluster of emulation processors. The self-testing circuit may include various components, such as a linear feedback shift register, a random bit generator, and a selector logic electrically coupled to each other. The random bit generator may determine a state of the linear feedback shift register. The random bit generator may generate a first random bit based upon the state of the linear feedback shift register and a corresponding bit position of an emulation instruction of the plurality of emulation instructions.

The selector logic may select the first random bit or an assembly register bit based upon a value of a bit at the corresponding bit position of the emulation instruction of the plurality of emulation instructions to output a corresponding self-test bit of a self-test instruction corresponding to the emulation instruction of the plurality of emulation instructions. In another embodiment, the selector logic may select the first random bit or a constant value based upon the value of the bit at the corresponding bit position of the emulation instruction of the plurality of emulation instructions to output the corresponding self-test bit of the self-test instruction corresponding to the emulation instruction of the plurality of emulation instructions.

The selector logic may be electrically coupled to a masking logic, which may mask a portion of the self-test instruction. The masking logic may process each self-test instruction to mask one or more bits in each self-test instruction. The masking of the one or more bits within each self-test instruction may prevent one or more updates to one or more state elements of the emulation system during execution of the self-test instruction.

The self-testing circuit electrically coupled to a second cluster of emulation processors may generate a second plurality of pseudorandom self-test instructions based upon a second plurality of emulation instructions, which may be stored in a non-transitory storage medium. The non-transitory storage medium may be electrically coupled to the second cluster of emulation processors. The random bit generator may determine a state of the linear feedback shift register. The random bit generator may generate a second random bit based upon the state of the linear feedback shift register and a corresponding bit position of an emulation instruction of the second plurality of emulation instructions.

The selector logic may select the second random bit or an assembly register bit based upon a value of a bit at the corresponding bit position of the emulation instruction of the second plurality of emulation instructions to output a corresponding self-test bit of a self-test instruction corresponding to the emulation instruction of the second plurality of emulation instructions. In another embodiment, the selector logic may select the random bit or a constant value based upon the value of the bit at the corresponding bit position of the emulation instruction of the second plurality of emulation instructions to output the corresponding self-test bit of the self-test instruction corresponding to the emulation instruction of the second plurality of emulation instructions.

At step 404, a cluster of emulation processors receive the plurality of pseudorandom self-test instructions from the self-testing circuit. The cluster of emulation processors may execute the plurality of pseudorandom self-test instructions to generate a corresponding plurality of deterministic outputs. A deterministic output of the plurality of deterministic outputs may include a cyclic redundancy check code associated with the cluster of emulation processors. The plurality of deterministic outputs may be deterministic because data arrays associated with the cluster of emulation processors may be pre-loaded during configuration with first known values and may output these first known values as the plurality of deterministic outputs upon the execution of the plurality of pseudorandom self-test instructions.

The second cluster of emulation processors may receive the second plurality of pseudorandom self-test instructions from the self-testing circuit. The second cluster of emulation processors may execute the second plurality of pseudorandom self-test instructions to generate a corresponding second plurality of deterministic outputs. A second deterministic output of the second plurality of deterministic outputs may include a second cyclic redundancy check code associated with the second cluster of emulation processors. The second plurality of deterministic outputs may be deterministic because the data arrays associated with the second cluster of emulation processors may be pre-loaded during configuration with second known values and may output these second specific known values as the second plurality of deterministic outputs upon the execution of the second plurality of pseudorandom self-test instructions.

At step 406, a testing processor compares the cyclic redundancy check code with the second cyclic redundancy check code to determine whether the cluster of emulation processors and the second cluster of emulation processors may have a hardware defect. The hardware defect may be a manufacturing defect, such as a defective wire. The hardware defect may be a design defect, such as a presence of false data or control path. When the cyclic redundancy check code and the second cyclic redundancy check code may have a same value, the testing processor may determine that the cluster of emulation processors and the second cluster of emulation processors may not have the hardware defect. When the cyclic redundancy check code and the second cyclic redundancy check code may not have the same value, the testing processor may determine that the cluster of emulation processors and the second cluster of emulation processors may have the hardware defect.

The emulation system may include a first emulation chip electrically coupled to the self-testing circuit. The first emulation chip may include a third cluster of emulation processors. The third cluster of emulation processors may include the cluster of emulation processors and the second cluster of emulation processors. The third cluster of emulation processors may be electrically connected to the self-testing circuit and placed hierarchically above the cluster of emulation processors and the second cluster of emulation processors. The cluster of emulation processors may generate a plurality of deterministic outputs. A deterministic output of the plurality of deterministic outputs may include a cyclic redundancy check code. The second cluster of emulation processors may generate a second plurality of deterministic outputs. A second deterministic output of the second plurality of deterministic outputs may include a second cyclic redundancy check code.

The emulation system may further include a second emulation chip electrically coupled to the self-testing circuit. The second emulation chip may include a fourth cluster of emulation processors. The fourth cluster of emulation processors may include a fifth cluster of emulation processors and a sixth cluster of emulation processors. The fourth cluster of emulation processors may be electrically connected to the self-testing circuit and placed hierarchically at the same level as the third cluster of emulation processors. The fifth cluster of emulation processors may generate a third plurality of deterministic outputs. A third deterministic output of the third plurality of deterministic outputs may include a third cyclic redundancy check code The sixth cluster of emulation processors may generate a fourth plurality of deterministic outputs. A fourth deterministic output of the fourth plurality of deterministic outputs may include a fourth cyclic redundancy check code.

The testing processor may determine whether the third cluster of emulation processors and the fourth cluster of emulation processors may have a hardware defect based upon comparing cyclic redundancy check codes associated with the cluster of processors having a same index in the third cluster of emulation processors and the fourth cluster of emulation processors. In one instance, the testing processor may determine whether the third cluster of emulation processors and the fourth cluster of emulation processors may have the hardware defect based upon comparing the cyclic redundancy check code to the third cyclic redundancy check code, which may be generated by the fifth cluster of emulation processors in the fourth cluster of processors having a same index as the cluster of emulation processors. In another instance, the testing processor may determine whether the third cluster of emulation processors and the fourth cluster of emulation processors may have the hardware defect based upon comparing the second cyclic redundancy check code to the fourth cyclic redundancy check code, which may be generated by the sixth cluster of emulation processors in the fourth cluster of processors having the same index as the second cluster of emulation processors.

FIG. 5 shows execution steps for generating self-test instructions for self-testing an emulation system, according to a method 500. The method 500 may include execution steps 502, 504, 506a, 506b, 508, and 510. It should be understood that the steps described herein are merely illustrative and additional or substitute steps should also be considered to be within the scope of this disclosure. Furthermore, methods with a fewer numbers of steps should also be considered to be within the scope of this disclosure. One or more components of an emulation system may perform different steps of the method 500.

At step 502, a self-testing circuit electrically coupled to a cluster of emulation processors receives an emulation instruction from a non-transitory memory. The non-transitory memory may be electrically coupled to the cluster of emulation processors. The self-testing circuit may include various components, such as a linear feedback shift register, a random bit generator, and a selector logic electrically coupled to each other. The random bit generator may determine a state of the linear feedback shift register.

At step 504, the self-testing circuit selects a bit from the emulation instruction. The bit may be 1. The bit may be 0.

At step 506a, when the selected bit is 1, the self-testing circuit randomly generates a self-test bit corresponding to the selected bit based upon the state of the linear feedback shift register and a position of the selected bit.

At step 506b, when the selected bit is 0, the self-testing circuit forces a constant value or a state of an assembly register as a self-test bit corresponding to the selected bit.

At step 508, the self-testing circuit transmits the self-test bit to the cluster of emulation processors.

At step 510, the self-testing circuit determines whether all bits from the emulation instruction have been selected. When all the bits from the emulation instruction have been selected, the self-testing circuit may receive another emulation instruction from the non-transitory memory. When all the bits from the emulation instruction have not been selected, the self-testing circuit may select another bit from the emulation instruction.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. An emulation system comprising:
a cluster of emulation processors;
a non-transitory storage medium electrically coupled to the cluster of emulation processors, and configured to store a plurality of emulation instructions to be executed by the cluster of emulation processors during an emulation cycle;
a self-testing circuit electrically coupled to the cluster of emulation processors, and configured to generate a plurality of pseudorandom self-test instructions based upon the plurality of emulation instructions;
the cluster of emulation processors configured to execute the plurality of pseudorandom self-test instructions and generate a corresponding plurality of deterministic outputs; and
a testing processor electrically coupled to the cluster of emulation processors, the testing processor configured to determine whether the cluster of emulation processors has a hardware defect based upon the plurality of deterministic outputs.

2. The emulation system of claim 1, wherein the self-testing circuit comprises a linear feedback shift register.

3. The emulation system of claim 2, wherein the self-testing circuit further comprises:
a random bit generator configured to generate a random bit based upon a state of the linear feedback shift register and a corresponding bit position of an emulation instruction of the plurality of emulation instructions.

4. The emulation system of claim 3, wherein the self-testing circuit further comprises:

a selector logic configured to select between the random bit and an assembly register bit based upon the value of the bit at the corresponding bit position of the emulation instruction to output a corresponding self-test bit of a self-test instruction corresponding to the emulation instruction.

5. The emulation system of claim 3, wherein the self-testing circuit further comprises:
a selector logic configured to select between the random bit and a constant value based upon the value of the bit at the corresponding bit position of the emulation instruction to output a corresponding self-test bit of a self-test instruction corresponding to the emulation instruction.

6. The emulation system of claim 1, wherein a deterministic output of the plurality of deterministic outputs comprises a cyclic redundancy check code associated with the cluster of emulation processors.

7. The emulation system of claim 6, further comprising:
a second cluster of emulation processors electrically coupled to the self-testing circuit;
a second non-transitory storage medium electrically coupled to the second cluster of emulation processors and storing a second plurality of emulation instructions to be executed by the second cluster of emulation processors during the emulation cycle;
the self-testing circuit configured to generate a second plurality of pseudorandom self-test instructions based upon the second plurality of emulation instructions;
the second cluster of emulation processors configured to execute the second plurality of pseudorandom self-test instructions and generate a corresponding second plurality of deterministic outputs, wherein a second deterministic output comprises a second cyclic redundancy check code associated with the second cluster of emulation processors; and
the testing processor in electronic communication with the second cluster of emulation processors, and configured to determine whether the cluster of emulation processors and the second cluster of emulation processors have a hardware defect based upon comparing the cyclic redundancy check code with the second cyclic redundancy check code.

8. The emulation system of claim 7, wherein the cluster of emulation processors and the second cluster of emulation processors are included in a third cluster of emulation processors electrically connected to the self-testing circuit and hierarchically above the cluster of emulation processors and the second cluster of emulation processors, the system further comprising:
a fourth cluster of emulation processors electrically coupled to the self-testing circuit and at hierarchically the same level as the third cluster of emulation processors;
the testing processor configured to determine whether the third cluster of emulation processors and the fourth cluster of emulation processors have a hardware defect based upon:
comparing the cyclic redundancy check code to a third cyclic redundancy check code in a third deterministic output generated by a fifth cluster of emulation processors in the fourth cluster of emulation processors having the same index as the cluster of emulation processors; and
comparing the second cyclic redundancy check code to a fourth cyclic redundancy check code in a fourth deterministic output generated by a sixth cluster of emulation processors having the same index as the second cluster of emulation processors.

9. The emulation system of claim 8, wherein the third cluster of emulation processors is in a first emulation chip and the fourth cluster of emulation processors in is a second emulation chip, each emulation chip being electrically coupled to the self-testing circuit, and wherein the testing processor is configured to determine whether the first emulation chip and the second emulation chip have a hardware defect by:
comparing the cyclic redundancy check code to the third cyclic redundancy check code; and
comparing the second cyclic redundancy check code to the fourth cyclic redundancy check code.

10. The emulation system of claim 1, further comprising:
a masking logic configured to mask a portion of at least one of the plurality of pseudorandom self-test instructions.

11. A method of self-testing a hardware emulator, the method comprising:
generating, by a self-testing circuit electrically coupled to a cluster of emulation processors, a plurality of pseudorandom self-test instructions based upon a plurality of emulation instructions stored in a non-transitory storage medium electrically coupled to the cluster of emulation processors;
executing, by the cluster of emulation processors, the plurality of pseudorandom self-test instructions to generate a corresponding plurality of deterministic outputs; and
determining, by a testing processor, whether the cluster of emulation processors has a hardware defect based upon the deterministic outputs.

12. The method of claim 11, wherein the self-testing circuit comprises a linear feedback shift register.

13. The method of claim 12, further comprising:
generating, by a random bit generator in the self-testing circuit, a random bit based upon a state of the linear feedback shift register and a corresponding bit position of an emulation instruction of the plurality of emulation instructions.

14. The method of claim 13, further comprising:
selecting, by a selector logic in the self-testing circuit, between the random bit and an assembly register bit based upon the value of the bit at the corresponding bit position of the emulation instruction to output a corresponding self-test bit of a self-test instruction corresponding to the emulation instruction.

15. The method of claim 13, wherein the self-testing circuit further comprises:
selecting, by a selector logic in the self-testing circuit, between the random bit and a constant value based upon the value of the bit at the corresponding bit position of the emulation instruction to output a corresponding self-test bit of a self-test instruction corresponding to the emulation instruction.

16. The method of claim 11, wherein the deterministic output of the plurality of deterministic outputs includes a cyclic redundancy check code associated with the cluster of emulation processors.

17. The method of claim 16, further comprising:
generating, by the self-testing circuit, a second plurality of pseudorandom self-test instructions based upon a second plurality of emulation instructions in a second non-transitory storage medium electrically coupled to a second cluster of emulation processors;

executing, by the second cluster of emulation processors, the second plurality of pseudorandom self-test instructions to generate corresponding second plurality of deterministic outputs, wherein a second deterministic output includes a second cyclic redundancy check code associated with the second cluster of emulation processors; and determining, by the testing processor, whether the cluster of emulation processors and the second cluster of emulation processors have a hardware defect based upon comparing the cyclic redundancy check code with the second cyclic redundancy check code.

18. The method of claim 17, wherein the cluster of emulation processors and the second cluster of emulation processors are included in a third cluster of emulation processors electrically connected to the self-testing circuit and hierarchically above the cluster of emulation processors and the second cluster of emulation processors, the method further comprising:

determining, by the testing processor, whether the third cluster of emulation processors and a fourth cluster of emulation processors, electrically coupled to the self-testing circuit and at hierarchically the same level as the third cluster of emulation processors, have a hardware defect based upon:

comparing, by the testing processor, the cyclic redundancy check code to a third cyclic redundancy check code in a third deterministic output generated by a fifth cluster of emulation processors in the fourth cluster of emulation processors having the same index as the cluster of emulation processors; and comparing, by the testing processor, the second cyclic redundancy check code to a fourth cyclic redundancy check code in a fourth deterministic output generated by a sixth cluster of emulation processors having the same index as the second cluster of emulation processors.

19. The method of claim 18, wherein the third cluster of emulation processors is in a first emulation chip and the fourth cluster of emulation processors in is a second emulation chip, each emulation chip being electrically coupled to the self-testing circuit, the method further comprising:

determining, by the testing processor, whether the first emulation chip and the second emulation chip have a hardware defect by:

comparing, by the testing processor, the cyclic redundancy check code to the third cyclic redundancy check code; and comparing, by the testing processor, the second cyclic redundancy check code to the fourth cyclic redundancy check code.

20. The method of claim 11, further comprising:

masking, by a masking logic, a portion of at least one of the plurality of pseudorandom self-test instructions.

* * * * *